United States Patent
Basu et al.

(10) Patent No.: US 10,580,926 B2
(45) Date of Patent: Mar. 3, 2020

(54) MULTI-JUNCTION SOLAR CELL

(71) Applicant: International Business Machines Corporation, Armonk, NY (US)

(72) Inventors: Anirban Basu, Lagrangeville, NY (US); Bahman Hekmatshoartabari, White Plains, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 15/296,269

(22) Filed: Oct. 18, 2016

(65) Prior Publication Data

US 2017/0040486 A1 Feb. 9, 2017

Related U.S. Application Data

(62) Division of application No. 14/504,600, filed on Oct. 2, 2014, now Pat. No. 9,530,921.

(51) Int. Cl.
*H01L 31/18* (2006.01)
*H01L 31/0376* (2006.01)
(Continued)

(52) U.S. Cl.
CPC ........ *H01L 31/1804* (2013.01); *H01L 27/142* (2013.01); *H01L 31/028* (2013.01);
(Continued)

(58) Field of Classification Search
CPC ... H01L 31/076; H01L 31/077; H01L 31/078; H01L 31/072; H01L 31/0725; H01L 31/0745

See application file for complete search history.

(56) References Cited

U.S. PATENT DOCUMENTS

| 4,219,830 A | 8/1980 | Gibbons |
| 5,437,734 A | 8/1995 | Matsushita et al. |

(Continued)

FOREIGN PATENT DOCUMENTS

| EP | 2490267 A2 | 8/2012 |
| GB | 2444562 A | 6/2008 |

(Continued)

OTHER PUBLICATIONS

Ayazian et al., "A Photovoltaic-Driven and Energy-Autonomous CMOS Implantable Sensor," IEEE Transactions on Biomedical Circuits and Systems, Aug. 2012, pp. 336-343, vol. 6, No. 4, © 2012 IEEE DOI: 10.1109/TBCAS.2011.2179030.

(Continued)

*Primary Examiner* — Bethany L Martin
(74) *Attorney, Agent, or Firm* — Brian D. Welle

(57) ABSTRACT

A multi-junction solar cell comprising a high-crystalline silicon solar cell and a high-crystalline germanium solar cell. The high-crystalline silicon solar including a first p-doped layer and a n+ layer and the high-crystalline germanium solar cell including a second p layer and a heavily doped layer. The multi-junction solar cell can also be comprised of a heavily doped silicon layer on a non-light receiving back surface of the high-crystalline germanium solar cell and a tunnel junction between the high-crystalline silicon solar cell and the high-crystalline germanium solar cell.

5 Claims, 5 Drawing Sheets

(51) Int. Cl.
*H01L 31/078* (2012.01)
*H01L 31/028* (2006.01)
*H01L 31/0368* (2006.01)
*H01L 27/142* (2014.01)
*H01L 31/0687* (2012.01)

(52) U.S. Cl.
CPC .. *H01L 31/03682* (2013.01); *H01L 31/03762* (2013.01); *H01L 31/0687* (2013.01); *H01L 31/078* (2013.01); *Y02E 10/544* (2013.01)

(56) References Cited

U.S. PATENT DOCUMENTS

| | | |
|---|---|---|
| 6,743,974 B2 | 6/2004 | Wada et al. |
| 7,151,307 B2 | 12/2006 | Boutros et al. |
| 8,445,310 B2 | 5/2013 | Bi et al. |
| 8,536,043 B2 | 9/2013 | Kim et al. |
| 8,552,470 B2 | 10/2013 | Chen et al. |
| 2004/0221887 A1 | 11/2004 | Kondo |
| 2005/0081910 A1 | 4/2005 | Danielson et al. |
| 2005/0196925 A1 | 9/2005 | Kim et al. |
| 2008/0173350 A1 | 7/2008 | Choi et al. |
| 2009/0120493 A1 | 5/2009 | Sinha |
| 2010/0083999 A1 | 4/2010 | Hovel |
| 2010/0283069 A1 | 11/2010 | Rogers |
| 2011/0005570 A1 | 1/2011 | Jain |
| 2011/0120538 A1 | 5/2011 | Lochtefeld |
| 2011/0139227 A1 | 6/2011 | Sivananthan |
| 2012/0118383 A1 | 5/2012 | Bedell et al. |
| 2013/0025658 A1 | 1/2013 | Bedell et al. |
| 2013/0074907 A1 | 3/2013 | Saunders |
| 2013/0260505 A1 | 10/2013 | Bedell et al. |
| 2013/0337601 A1 | 12/2013 | Kapur et al. |
| 2014/0008726 A1 | 1/2014 | Hsiao et al. |
| 2014/0322861 A1* | 10/2014 | Tsuda .............. H01L 31/022425 438/98 |
| 2016/0099370 A1 | 4/2016 | Basu et al. |

FOREIGN PATENT DOCUMENTS

| | | |
|---|---|---|
| JP | 2012129349 A | 7/2012 |
| TW | 201327869 A | 7/2013 |
| WO | 2011163437 A2 | 12/2011 |

OTHER PUBLICATIONS

Sun et al., "High efficiency thin-film crystalline Si/Ge tandem solar cell," Optics Express, Feb. 15, 2010, vol. 18, No. 4, pp. 3746-3753, Optical Society of America (OSA).

Basu et al., "Multi-Junction Solar Cell," U.S. Appl. No. 15/296,296, filed Oct. 18, 2016.

List of IBM Patents or Patent Applications Treated as Related, Signed Oct. 18, 2016, 2 pages.

* cited by examiner

MULTI-JUNCTION SOLAR CELL

BACKGROUND

The present disclosure relates to solar cells, and more specifically, to multi-junction solar cells.

Multi-junction solar cells can include multiple solar cells made of different semiconductor materials and comprise multiple p-n junctions. Using multiple semiconducting materials can allow a multi-junction solar cell to absorb a broader range of wavelengths of light. For example, a first solar cell can have a bandgap energy that requires at least the absorption of a blue photon (450-495 nm wavelength) for an electron to have the bandgap energy to move from the valence band to the conduction band. As a result, light with wavelengths greater than blue photons may pass through the first solar cell. However, a second solar cell having a bandgap energy that only requires the absorption of a red photon (620-750 nm wavelength) for an electron to have the bandgap energy to move from the valence band to the conduction can be placed at a back surface of the first solar cell. Light that passes through the first solar cell may then be absorbed by the second solar cell, potentially improving the sunlight to electrical energy conversion efficiency.

SUMMARY

According to embodiments of the present disclosure, a method is disclosed for forming a multi-junction solar cell. In various embodiments, the method may include forming a high-crystalline silicon solar cell that includes a first p-doped layer and a n+ layer. The method may also include forming a high-crystalline germanium solar cell that includes a second p layer and a heavily doped layer. In addition, the method may include forming a heavily doped silicon layer on a non-light receiving back surface of the high-crystalline germanium solar cell. Furthermore, the method may include forming a tunnel junction between the high-crystalline silicon solar cell and the high-crystalline germanium solar cell.

According to embodiments of the present disclosure, a multi-junction solar cell is disclosed. In various embodiments, the multi-junction solar cell may include a high-crystalline silicon solar cell. The high-crystalline silicon solar cell may include a first p-doped layer at a front surface of the high-crystalline solar cell and an n+ layer at a back surface of the high-crystalline solar cell. The multi-junction solar cell may also include a high-crystalline germanium solar cell. The high-crystalline germanium solar cell may include a p+ layer at a front surface of the high-crystalline germanium solar cell and a second p-dope layer at a back surface of the high-crystalline germanium solar cell. In addition the multi-junction solar cell may include an n+ silicon layer formed on the back surface of the high-crystalline germanium solar cell. Furthermore, the multi-junction solar cell may include a tunnel junction between the high-crystalline silicon solar cell and the high-crystalline germanium solar cell.

According to embodiments of the present disclosure, a multi-junction solar cell is disclosed. In various embodiments, the multi-junction solar cell may include a high-crystalline silicon solar cell. The high-crystalline silicon solar cell may include an n-doped layer at a front surface of the high-crystalline solar cell and a first p-doped layer at a back surface of the high-crystalline solar cell. The multi-junction solar cell may also include a high-crystalline germanium solar cell. The high-crystalline germanium solar cell may include a first n+ layer at a front surface of the high-crystalline germanium solar cell and a second p-dope layer at a back surface of the high-crystalline germanium solar cell. In addition, the multi-junction solar cell may include a p+ silicon layer formed on the back surface of the high-crystalline germanium solar cell. Furthermore, the multi-junction solar cell may include a tunnel junction between the high-crystalline silicon solar cell and the high-crystalline germanium solar cell.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
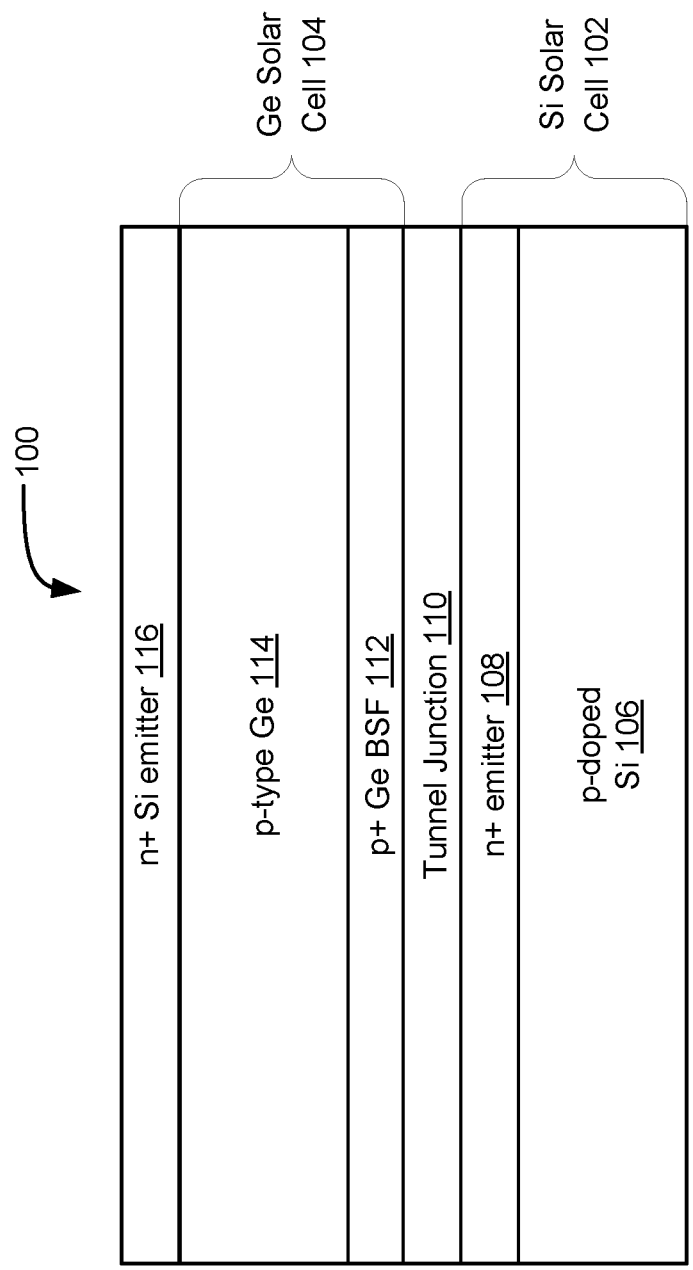
FIG. 1 depicts a multi-junction solar cell, consistent with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to solar cells, more particular aspects relate to multi-junction solar cells. While the present disclosure is not necessarily limited to such applications, various aspects of the disclosure may be appreciated through a discussion of various examples using this context.

Various embodiments of the present disclosure are directed toward multi-junction solar cells. In particular embodiments, the multi-junction solar cell can be a tandem solar cell comprised of a high-crystalline silicon solar cell and a high-crystalline germanium solar cell. In various embodiments, the multi-junction solar cell can also include a tunnel junction between the silicon solar cell and the germanium solar cell. In addition, a silicon layer can be formed on the germanium solar cell.

According to various embodiments, the tunnel junction can be between a back surface of the silicon solar cell and a front surface of the germanium solar cell. A tunnel junction can provide a low electrical resistance and optically low-loss connection between the silicon solar cell and the germanium solar cell. In various embodiments, a p-n junction could be established between the silicon solar cell and the germanium solar cell. This could create a depletion region that makes it difficult for electrons to flow between the solar cells. The tunnel junction can function as an electrical contact between the silicon solar cell and the germanium solar cell, effectively allowing electrons to move through the depletion region more easily.

In certain embodiments, the silicon solar cell can be configured with a p-n junction where the p-doped side is located at a front surface of the silicon solar cell and the n-doped side is located on the back surface of the silicon solar cell. In addition, the n-doped side can be an n+ emitter that can potentially reduce surface recombination of minority carriers at the back surface of the silicon solar cell. In particular embodiments, the germanium cell can also be p-doped. In certain embodiments, the front surface of the germanium solar cell can be configured with a p+ layer. The p+ layer can potentially establish a back surface field (BSF) that can reduce surface recombination of minority carriers at the front surface of the germanium solar cell. Various embodiments can also have an n-doped silicon layer formed on a back surface of the germanium solar cell. The n-doped silicon layer can be an n+ emitter that can potentially both establish a p-n junction between the silicon layer and the back surface of the germanium solar cell and reduce the surface recombination of minority carriers at a back surface of the n-doped silicon layer.

In other embodiments, the silicon solar cell can be configured with a p-n junction where the n-doped side is located on the front surface of the silicon solar cell and the p-doped side is located on the back surface of the silicon solar cell. The n-doped side can be further subdivided with an n+ emitter at the front surface that can potentially reduce surface recombination of minority carriers at the front surface of the silicon solar cell. In addition, the p-doped side can be further subdivided with a p+ layer at the back surface that can potentially establish a BSF and reduce surface recombination of minority carriers at the back surface of the silicon solar cell. In particular embodiments, the germanium cell can be configured with a p-n junction where the n-doped side is located on the front surface of the germanium solar cell and the p-doped side is located on the back surface of the germanium solar cell. According to particular embodiments, the n-doped side can be an n+ emitter that can potentially reduce the surface recombination of minority carriers at the front surface of the germanium solar cell. Various embodiments can also have a p-doped silicon layer formed on the back surface of the germanium solar cell. The p-doped silicon layer can be a p+ layer that can potentially establish a BSF and reduce the surface recombination of minority carriers at the back surface of the p-doped silicon layer.

Various embodiments of the multi-junction solar cell can be used in many electrical applications. For instance, the multi-junction solar cell can be used to power a monolithic circuit. One method of connecting the multi-junction solar cell to a monolithic circuit is by using a Smart Cut process. For example, the back surface of the silicon layer can be oxidized. Using a second silicon substrate, a layer at a front surface of the second silicon substrate can be oxidized. The front surface of the second silicon substrate can then be connected to the back surface of the silicon layer. A wafer including the oxidized front surface can then be cut from the second silicon substrate. Monolithic circuits can then be fabricated on the back surface of the wafer similar to the way they are fabricated using plain silicon wafers. Power may then be supplied to the monolithic circuit by connecting the monolithic circuit to the germanium solar cell. For instance, a semi-conductor such as a III-V semiconductor that can match the photocurrent generated from the silicon solar cell and the photocurrent generated from the germanium solar cell, can be connected to the germanium solar cell and power can be supplied to the monolithic circuit.

Turning now to the figures, FIG. 1 depicts a multi-junction solar cell 100, consistent with embodiments of the present disclosure. According to various embodiments, the solar cell 100 can be a tandem, two layer, solar cell comprising a high-crystalline solar cell 102 in front of a high-crystalline germanium solar cell 104. A solar cell's crystalline efficiency can be determined by the ratio of the electrical output of the solar cell to the energy striking the solar cell, such as the energy from the photons that strike the solar cell emitted from the sun. The energy conversion efficiency (the determiner of whether a crystalline structure is low, medium, or high) can be the percentage of the energy to which the solar cell is exposed that is converted into electrical energy. Solar cell efficiencies can vary. For example, an amorphous silicon-based solar cell can have an efficiency of 6% and a multi-junction production cell can have an efficiency of 44.0%. Solar cell energy conversion efficiencies for commercially available multi-crystalline silicon solar cells can be around 14-19%. Crystalline silicon devices may be approaching a theoretical limiting efficiency of 29.4%. Silicon solar cells created in a lab can have efficiencies around 25%, while lab examples of multi-junction cells may have over 43% efficiency. Tandem cells may have 30% efficiency under sunlight, and may have 40% efficiency under concentrated sunlight.

In particular embodiments, the silicon solar cell 102 may be in front of the germanium solar cell 104, meaning photons that are absorbed by the germanium solar cell, first pass through the silicon solar cell. Silicon has a wider bandgap than that of germanium. Germanium may cover the 300 to 1600 nm wavelength range compared with the 300 to 1060 nm range that may be covered by silicon. A germanium solar cell can potentially absorb photons spanning more wavelengths than a silicon solar cell. As a result, by placing the silicon solar cell in front of the germanium solar cell, photons with higher energy levels (e.g., 300 nm wavelengths) can potentially be absorbed by the silicon solar cell and photons with lower energy levels that can only be absorbed by germanium (e.g., 1600 nm wavelengths), can pass through the silicon solar cell and potentially be absorbed by the germanium solar cell. In addition, according to particular embodiments, the germanium cell can also contain carbon or tin atoms (germanium-carbon or germanium-tin alloys) to engineer a lattice constant of the alloy layer, potentially allowing further adjustment of the bandgap of the germanium. On the other hand, if the germanium solar cell were placed in front of the silicon solar cell, photons with higher energy levels may be absorbed by the germanium instead of the germanium absorbing the photons with lower energy levels. The lower energy photons may then pass through the silicon solar cell, lowering the energy conversion efficiency of the multi-junction solar cell.

In various embodiments, the silicon solar cell 102 can be configured with a p-n junction. In particular embodiments, a p-doped region 106 is located at a front surface of the silicon solar cell and extends across the silicon solar cell to the p-n junction. An n-doped region 108 is located at a back surface of the silicon solar cell and extends across the silicon solar cell to the p-n junction. The p-n junction can be created by introducing impurities in the silicon solar cell. For instance, to create the p-doped region 106, the silicon solar cell can be doped with boron atoms. To create the n-doped region 108, the silicon solar cell can be doped with phosphorus atoms. The regions can then form a p-n junction, creating an electric field within the silicon solar cell 102 that has a drift current and a diffusion current that essentially cancel each other out. However, when photons from a light source (e.g., the sun) strike the silicon solar cell and are absorbed, the diffusion current can be greater than the drift current, creating a photocurrent. Similarly, the germanium solar cell 104 can be p-doped and an n-doped silicon layer 116 can be formed on a back surface of the germanium solar cell. A p-n junction can then be established and when photons are absorbed by the germanium solar cell, a photocurrent can be created.

According to various embodiments, a tunnel junction 110 can be located between the silicon solar cell 102 and the germanium solar cell 104. For monolithic cells, the positive and negative contacts can be located at the top and bottom of the multi-junction solar cell. As a result, carriers (e.g., electrons and holes) produced when the electrical current is created, may need to travel through the silicon solar cell to the germanium solar cell, or vice versa, without recombining, to reach the contacts. The tunnel junction 110 can formed on the silicon solar cell to aid the movement of the electrons and holes to and from the silicon and germanium solar cells. As a result, the tunnel junction can minimize the electrical losses (voltage drops) between the solar cells. In addition, the tunnel junction can minimize optical losses (photon absorption), so photons that are not absorbed by the silicon solar cell 102 can flow through the tunnel junction and be absorbed by the germanium solar cell 104.

Particular embodiments of the n-doped region 108 of the silicon solar cell 102 can be silicon-germanium (SiGe). The degradation of the electronic properties of the multi-junction solar cell 100 can be caused by a mismatch in the lattice structure of the silicon and germanium solar cells. In certain embodiments, using SiGe for the n-doped region 108 can result in a better matching of the lattice structures of the silicon solar cell with the germanium solar cell.

In various embodiments, the p-doped region of the germanium solar cell 104 can be further configured to have a p-doped region 114 at the back surface of the germanium solar cell and a p+ BSF region 112 at a front surface of the germanium solar cell. Surface recombination can have an impact on the photocurrent produced. The p+ BSF 112 can consists of a higher doped region at the front surface of the germanium solar cell. The interface between the p-doped region 114 and the p+ BSF 112 can behave like a p-n junction and an electric field can form at the interface which introduces a barrier to minority carriers, in this case electrons, flow to the front surface of the germanium solar cell 104. As a result, the minority carrier (electron) concentration can be maintained at higher levels in the p-doped region 114.

According to certain embodiments, the n-doped region 108 of the silicon solar cell and the n-doped silicon layer 116 can be configured to be n+ emitters. These highly doped regions can have a similar impact as the p+ BSF region 112. However, in this case, the minority carries would be holes. As a result, the higher level of hole concentration can be maintained away from the back surface of the silicon solar cell 102 and the higher level of hole concentration can be maintained near the back surface of the germanium solar cell 104.

Figure 2:
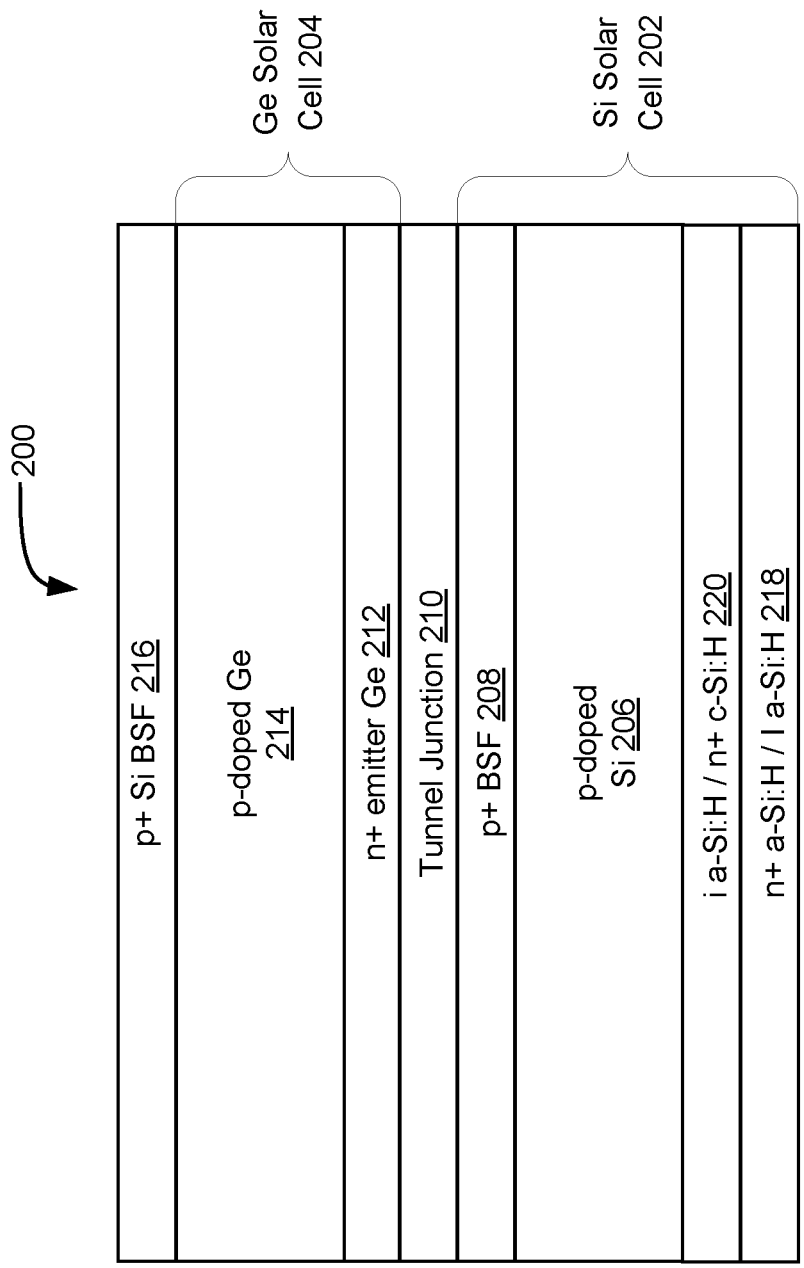
FIG. 2 depicts a multi-junction solar cell, consistent with embodiments of the present disclosure.

FIG. 2 depicts a multi-junction solar cell 200, consistent with embodiments of the present disclosure. Similar to FIG. 1, the multi-junction solar cell 200 can include a high-crystalline silicon solar cell 202 in front of a high-crystalline germanium solar cell 204. However, the p-n junctions of the multi-junction solar cell 200 are reversed from those of the multi-junction solar cell 100. In particular embodiments, an n-doped region 218 can be located at a front surface of the silicon solar cell and extend across the silicon solar cell to the p-n junction and a p-doped region 206 can be located at a back surface of the silicon solar cell and extend across the silicon solar cell to the p-n junction. In addition, the germanium solar cell 204 can be configured with a p-n junction. In certain embodiments, an n-doped region 212 can be located at a front surface of the germanium solar cell and extend across the germanium solar cell to the p-n junction and a p-doped region 214 can be located a back surface of the germanium solar cell and extend across the germanium solar cell to the p-n junction. Furthermore, the multi-junction solar cell can be configured with a tunnel junction 210, similar to the tunnel junction 110, from FIG. 1.

According to various embodiments, the n-doped region may be further configured to have a heavily n-doped (e.g., concentration above about $10^{18}$ cm$^{-3}$ at room temperature) amorphous silicon region (n+ a-Si:H) 218 located at the front end of the silicon solar cell and a lightly n-doped (e.g., concentration below about $10^{13}$ cm$^{-3}$ at room temperature) amorphous silicon region (i a-Si:H) 220 can be located between the p-doped region and the n+ a-Si:H region 218. In this embodiment, a PIN (p-region, intrinsic region, n-region) structure can be established. A PIN structure can potentially be a better long wavelength response. A photon with a longer wavelength may penetrate deep into the multi-junction solar cell 200. The depletion region of a PIN structure may extend deep into the multi-junction solar cell. A deeper depletion region could enable electron-hole pair generation deep within the multi-junction solar cell and increase the energy conversion efficiency of the multi-junction solar cell.

In another embodiment, the n-doped region can have a heavily n-doped amorphous silicon region (n+ a-Si:H) 218 located at the front end of the silicon solar cell and a heavily doped crystalline silicon region (n+ c-Si:H) 220 located between the p-doped region and the n+ a-Si:H region 218. In this embodiment, the n+ a-Si:H region 218 and the n+ c-Si:H 220 region can have a similar impact as the p+ BSF region 112, from FIG. 1. As a result, the heavily doped regions can have a strong electric field that forms at the interface of the n-doped region and the p-doped region of the silicon solar cell 202. This interface can introduce a barrier to minority carriers, in this case holes, that decreases recombination and increases the energy conversion efficiency of the multi-junction solar cell.

In yet another embodiment, the n-doped region can have a lightly n-doped amorphous silicon region (i a-Si:H) 218 located at the front end of the silicon solar cell and a heavily doped crystalline silicon region (n+ c-Si:H) 220 located between the p-doped region and the i a-Si:H region 218. In this embodiment, the i a-Si:H region 218 can reach higher efficiencies by stacking multiple layers of i a-Si:H and each layer can be tuned to work well at a specific frequency of light.

In various embodiments, the p-doped region of the silicon solar cell 202 can be further configured to have a p-doped region 206 at the p-n junction and extend across the silicon solar cell and a p+ BSF region 208 at the back surface of the silicon solar cell. The interface between the p-doped region 206 and the p+ BSF 208 can behave like a p-n junction and an electric field can form at the interface which introduces a barrier to minority carriers, in this case electrons, flow to the back surface of the silicon solar cell 104. As a result, the minority carrier (electron) concentration can be maintained at higher levels in the p-doped region 206.

According to certain embodiments, the n-doped region 212 of the germanium solar cell can be configured to be an n+ emitter. This heavily doped region can have a similar impact as the p+ BSF region 208. However, in this case, the minority carries would be holes. As a result, the higher level of hole concentration can be maintained away from the front surface of the germanium solar cell 204. In addition, in various embodiments, a p-doped silicon layer 216 can be formed on a back surface of the germanium solar cell and be configured to be a p+ BSF region. This heavily doped region can have a similar impact as the p+ BSF region 208. As a result, the minority carrier (electron) concentration can be maintained at higher levels in the p-doped region 214 of the germanium solar cell 204.

Figure 3:
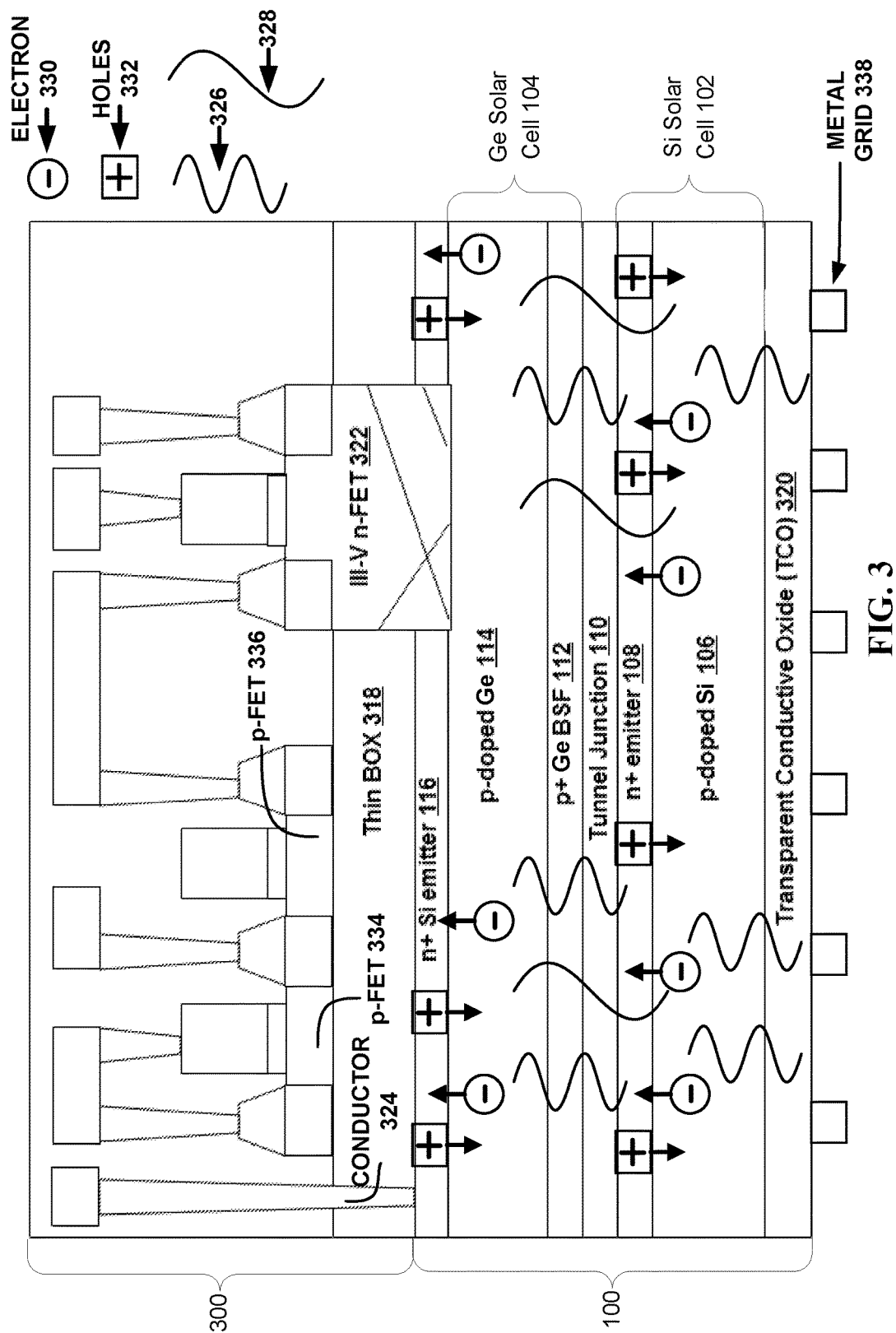
FIG. 3 depicts a monolithic circuit connected to a multi-junction solar cell, consistent with embodiments of the present disclosure.

FIG. 3 depicts a monolithic circuit 300 connected to the multi-junction solar cell 100, consistent with embodiments of the present disclosure. In various embodiments, the multi-junction solar cell 100 can be used to power the monolithic circuit 300. In order to generate power, a voltage may need to be generated as well as a current. Voltage is generated in a multi-junction solar cell by a process known as the "photovoltaic effect". For example, photons 326 and 328 may strike the multi-junction solar cell 100. In various embodiments, the multi-junction solar cell may be configured with a transparent conducting film 320 to act as an anti-reflection coating and allow photons 326 and 328 to pass through to the multi-junction solar cell. A metal grid 338 may also be present to allow carrier transport out of the multi-junction solar cell.

According to various embodiments, the silicon solar cell 102 may be located in front of the germanium solar cell 104. As stated herein, silicon has a wider bandgap than that of germanium. As a result, photons 328 may not have the energy to move an electron in the silicon solar cell from the valence band to the conduction band and they may pass through the silicon solar cell. On the hand, photons 326 may have enough energy to move an electron in the silicon solar cell from the valence band to the conduction band and some of them may be absorbed by the silicon solar cell, while others still pass through. Furthermore, the photons 326 and 328 that flow through the silicon solar cell 102 may be absorbed by the germanium solar cell 104.

The collection of photons by the silicon and germanium solar cells can cause a movement of electrons 330 to the n-doped regions 108 and 116 and holes 332 to the p-doped regions 106, 112, and 114. This separation of charge creates an electric field at the junctions which is in opposition to that already existing at the p-n junctions, thereby reducing the electric fields at the p-n junctions. The reduction of the electric fields can increase the diffusion current. Furthermore, by using the tunnel junction 110 to decrease the resistance between the silicon solar cell 102 and the germanium solar cell 104, electrons 330 can travel from the silicon solar cell to the germanium solar cell and holes 332 can travel from the germanium solar cell to the silicon solar cell. As a result, a voltage can be established across the multi-junction solar cell 100.

According to various embodiments, the monolithic circuit 300 can be connected to the multi-junction solar cell 100. As stated herein, the monolithic circuit can be connected using the Smart Cut process. As shown, thin box 318 can be a combination of an oxidized front surface of a second silicon substrate connected to the oxidized back surface of the silicon layer 116. p-FET's 334 and 336 can then be fabricated from the un-oxidized portion of the silicon wafer cut from the second silicon substrate and the monolithic circuit 300 can be fabricated on the back surface of the silicon wafer. External inputs III-V n-FET 322 and a conductor 324 can then can be connected to the germanium solar cell and power can be supplied to the monolithic circuit.

Figure 4:
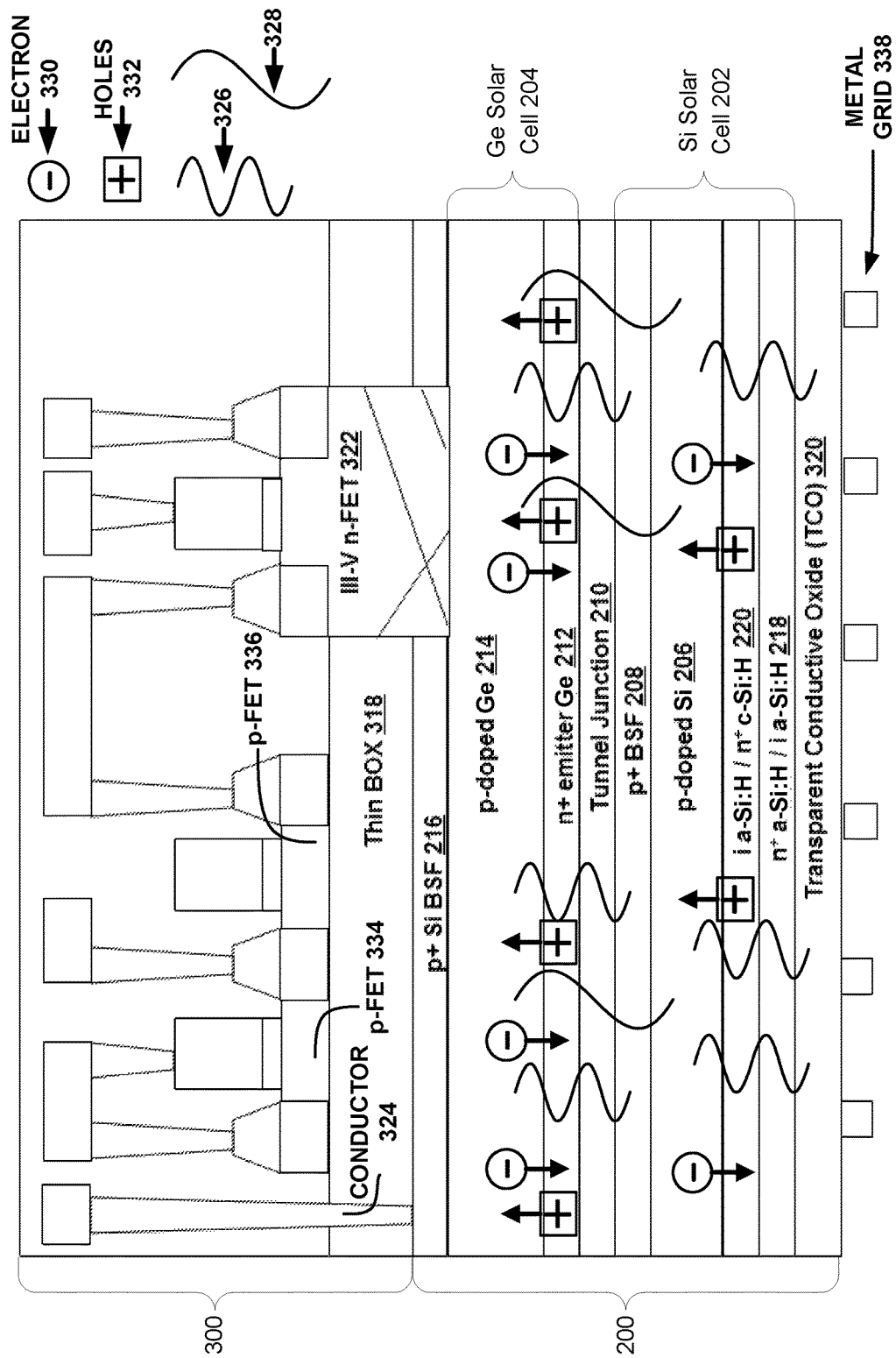
FIG. 4 depicts a monolithic circuit connected to a multi-junction solar cell, consistent with embodiments of the present disclosure.

FIG. 4 depicts a monolithic circuit 300 connected to the multi-junction solar cell 200, consistent with embodiments of the present disclosure. The multi-junction solar cell 200 can operate similar to the multi-junction solar cell 100 discussed in FIG. 3. However, because the p-n junctions of the multi-junction solar cell 200 are reversed from those of multi-junction solar cell 100, the direction of movement of the electrons 330 and holes 332 may be reversed from direction of movement of the electrons 330 and holes 332, from FIG. 3. Furthermore, a voltage can be established across the multi-junction solar cell 200 due to the movement of electrons 330 and holes 332 and supply power to the monolithic circuit 300 via external input III-V n-FET 322 and conductor 324.

Figure 5:
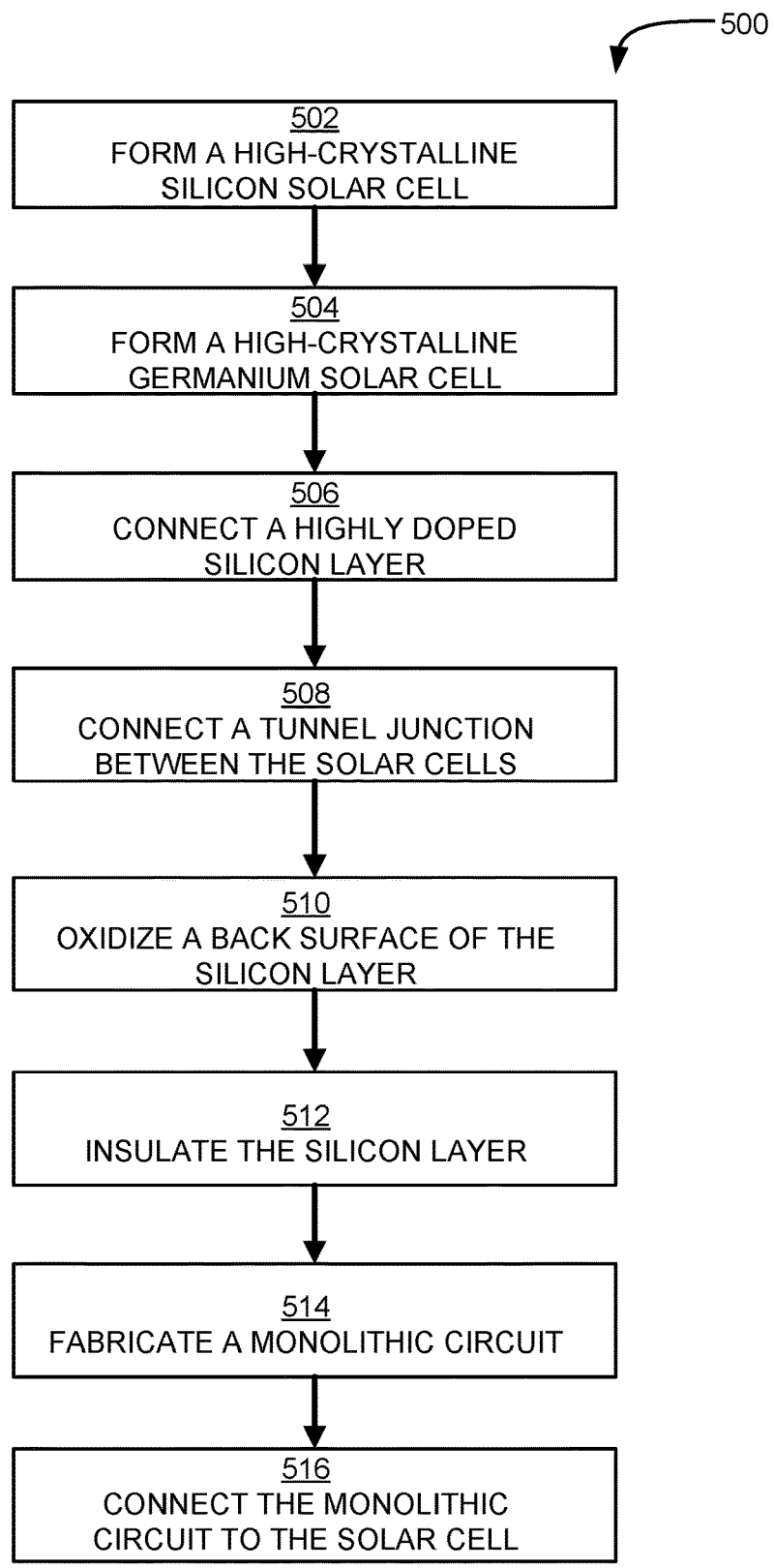
FIG. 5 depicts a method 500 for forming a multi-junction solar cell and connecting a monolithic circuit, consistent with embodiments of the present disclosure.

FIG. 5 depicts a method 500 for forming a multi-junction solar cell and connecting a monolithic circuit, consistent with embodiments of the present disclosure. In operation 502, a high-crystalline silicon solar cell can be formed. The high-crystalline silicon solar cell can include a p-n junction. In certain embodiments, the p-doped layer can be located at a light receiving front surface of the silicon solar cell and the n-doped layer can be located on a non-light receiving back surface of the silicon solar cell. In addition, the n-doped side can be an n+ emitter that can potentially reduce surface recombination of the holes at the back surface of the silicon solar cell. In other embodiments, the n-doped layer can be further subdivided into a hydrogenated amorphous silicon layer (i a-Si:H) and an n+ emitter, such as n+ c-Si:H or n+ a-Si:H, at the front surface that can potentially reduce surface recombination of holes at the front surface of the silicon solar cell. In addition, the p-doped side can be further subdivided with a p+ layer at the back surface that can potentially establish a BSF and reduce surface recombination of electrons at the back surface of the silicon solar cell.

In operation 504, a high-crystalline germanium solar cell can be formed. The high-crystalline germanium solar cell can have a p-doped layer and another heavily doped layer. In various embodiments, the heavily doped layer can be a p+ layer. The p+ layer can potentially establish a BSF that can reduce surface recombination of electrons at a light receiving front surface of the germanium solar cell. In other embodiments, the heavily doped layer can be an n+ emitter layer that can potentially reduce the surface recombination of holes at the front surface of the germanium solar cell.

In operation 506, a heavily doped silicon layer can be formed on a non-light receiving back surface of the high-crystalline germanium solar cell. In certain embodiments, the heavily doped silicon layer can be an n+ emitter that can potentially both establish a p-n junction between the silicon layer and the back surface of the germanium solar cell and reduce the surface recombination of holes at a back surface of the n-doped silicon layer. In another embodiment, the heavily doped silicon layer can be a p+ silicon layer that can potentially establish a BSF and reduce the surface recombination of electrons at the back surface of the silicon layer.

In operation 508, a tunnel junction can be formed between the high-crystalline silicon solar cell and the high-crystalline germanium solar cell. The tunnel junction can function as an electrical contact between the silicon solar cell and the germanium solar cell, effectively allowing electrons to move through the depletion region more easily.

According to various embodiments, a monolithic solar cell can then be fabricated and connected to the multi-junction solar cell. The monolithic circuit can be connected using the process known as Smart Cut. In operation 510, a layer at a back surface of the highly doped silicon layer can be oxidized. Using a second silicon substrate, a layer at a front surface of the second silicon substrate can be oxidized. In operation 512, the front surface of the second silicon substrate can then be connected to the back surface of the silicon layer, insulating the highly doped silicon layer. An insulating wafer substrate, including the oxidized front surface, can then be cut from the second silicon substrate. In operation 514, the monolithic circuit can then be fabricated on a back surface of the insulating wafer substrate similar to the way they are fabricated using plain silicon wafers. In operation 516, power can be supplied to the monolithic circuit by connecting the monolithic circuit to the high-crystalline germanium solar cell using a III-V compound semiconductor that can potentially match the photocurrent generated from the silicon solar cell and the photocurrent generated from the germanium solar cell.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of forming a multi junction solar cell, the method comprising:
   forming a crystalline silicon solar cell including:
      a silicon p-doped region at a back surface of the crystalline silicon solar cell, and
      a n+ region at a front surface of the crystalline silicon solar cell;
   forming a crystalline germanium solar cell including:
      a germanium p-doped layer at a back surface of the crystalline germanium solar cell, and
      a germanium n+ layer at a front surface of the crystalline germanium solar cell;
   forming a p+ silicon layer on the back surface of the crystalline germanium solar cell;
   forming a tunnel junction between the crystalline silicon solar cell and the crystalline germanium solar cell;
   forming an $SiO_2$ layer connected to a back surface of the p+ silicon layer; and
   connecting at least one transistor of a monolithic circuit to the germanium n+ layer through the $SiO_2$ layer.

2. The method of claim 1, wherein an i-type layer is between the silicon p-doped region and the n+ region and the silicon p-doped region further includes:
   a p+ layer at the back surface of the crystalline silicon solar cell.

3. The method of claim 2, wherein the i-type layer includes a hydrogenated amorphous silicon layer.

4. The method of claim 1, further comprising:
   oxidizing a layer located at a back surface of the p+ silicon layer;
   insulating the p+ silicon layer; and
   fabricating the monolithic circuit on a back surface of the insulated p+ silicon layer.

5. The method of claim 4, further comprising:
   connecting the monolithic circuit to the crystalline germanium solar cell using a III-V compound semiconductor.

* * * * *